United States Patent
Gromann et al.

(10) Patent No.: US 9,938,635 B2
(45) Date of Patent: Apr. 10, 2018

(54) METHOD FOR PRODUCING A COMPONENT, PARTICULARLY FOR USE IN A CRUCIBLE PULLING METHOD FOR QUARTZ GLASS

(71) Applicant: Heraeus Quarzglas GmbH & Co. KG, Hanau (DE)

(72) Inventors: Boris Gromann, Aschaffenburg (DE); Nigel Whippey, Seligenstadt (DE); Christian Schenk, Ingelheim (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 280 days.

(21) Appl. No.: 14/710,374

(22) Filed: May 12, 2015

(65) Prior Publication Data

US 2015/0337455 A1 Nov. 26, 2015

(30) Foreign Application Priority Data

May 22, 2014 (EP) .................................... 14001805

(51) Int. Cl.
*C30B 15/10* (2006.01)
*C30B 29/18* (2006.01)
(Continued)

(52) U.S. Cl.
CPC ............ *C30B 15/10* (2013.01); *B23K 20/002* (2013.01); *B23K 20/02* (2013.01); *C03B 5/08* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 3,324,543 A | * | 6/1967 | McConnaughey | ....... B22F 7/08 228/124.6 |
| 5,333,844 A | * | 8/1994 | Holcombe | .............. F27B 14/10 137/910 |

(Continued)

FOREIGN PATENT DOCUMENTS

| DE | 10 2005 061 274 A1 | 6/2007 |
|---|---|---|
| GB | 339268 | 9/1929 |

(Continued)

OTHER PUBLICATIONS

Espacenet, English language abstract for DE 10 2005 061 274 (A1), published Jun. 21, 2007.

(Continued)

*Primary Examiner* — Duy Deo
*Assistant Examiner* — Erin Bergner
(74) *Attorney, Agent, or Firm* — Tiajoloff & Kelly LLP

(57) ABSTRACT

A method for producing a component includes joining individual wall parts, especially for producing a melting crucible for use at a high operating temperature in a crucible-pulling method for quartz glass, wherein at least two wall parts of a refractory metal or of a base alloy of a refractory metal are provided, butt-joined to form a joint and joined together by sintering at a temperature above 1500° C. to form the component. A sealant is inserted into the joint to provide a component of improved tightness and to ensure improved sintering of the individual parts of the component. A component produced according to the method, particularly a melting crucible, particularly in a crucible pulling method for quartz glass, has the joint between the butt-joined walls closed in a gas-tight manner by a sealant.

11 Claims, 2 Drawing Sheets

(51) Int. Cl.
   *C03B 15/14* (2006.01)
   *B23K 20/02* (2006.01)
   *B23K 20/00* (2006.01)
   *C03B 5/08* (2006.01)
   *C03B 5/42* (2006.01)
   *C03B 5/43* (2006.01)
   *C03B 17/04* (2006.01)

(52) U.S. Cl.
   CPC ............... *C03B 5/42* (2013.01); *C03B 5/43* (2013.01); *C03B 15/14* (2013.01); *C03B 17/04* (2013.01); *C30B 29/18* (2013.01); *Y10T 117/1032* (2015.01)

(56) References Cited

U.S. PATENT DOCUMENTS

| | | |
|---|---|---|
| 6,422,861 B1 | 6/2002 | Antczak et al. |
| 6,632,086 B1 | 10/2003 | Antczak et al. |
| 6,739,155 B1 | 5/2004 | Giddings et al. |
| 2002/0022135 A1* | 2/2002 | Kock .................. C03B 5/43 428/434 |
| 2008/0196448 A1* | 8/2008 | Borens ................ B82Y 5/00 65/17.1 |
| 2010/0139550 A1* | 6/2010 | Aichele .............. C30B 11/002 117/35 |
| 2011/0281227 A1* | 11/2011 | Franz .................. C03B 5/0336 432/264 |
| 2012/0242016 A1* | 9/2012 | Freudenberg ........ C30B 35/002 266/242 |
| 2015/0239765 A1* | 8/2015 | Niwa .................. C03B 5/425 65/66 |

FOREIGN PATENT DOCUMENTS

| | | |
|---|---|---|
| JP | H02 022132 A | 1/1990 |
| NL | 2003916 | 6/2011 |
| WO | 2007105550 A1 | 9/2007 |

OTHER PUBLICATIONS

Espacenet English Language Abstract for JP H02 022132 A, published Jan. 25, 1990.

* cited by examiner

METHOD FOR PRODUCING A COMPONENT, PARTICULARLY FOR USE IN A CRUCIBLE PULLING METHOD FOR QUARTZ GLASS

The present invention refers to a method for producing a component by joining wall parts—especially for producing a melting crucible for use at a high operating temperature in a crucible pulling method for quartz glass, in that at least two wall parts of a refractory metal or of a base alloy of a refractory metal are provided, butt-joined to form a joint and joined together by sintering at a temperature above 1500° C. to form the component.

Furthermore, the present invention refers to a component, particularly a melting crucible, particularly in a crucible pulling method for quartz glass, which comprises at least two wall parts of a refractory metal or of a base alloy of a refractory metal that are butt-joined to form a joint.

PRIOR ART

Crucible pulling methods are in use for the production of cylindrical components of quartz glass with any desired cross-sectional profile. The melting crucibles used consist of refractory metals which inter alia include the group of the metals hafnium (Hf), niobium (Nb), tantalum (Ta), molybdenum (Mo) and tungsten (W). As a rule, crucibles of tungsten are used. Apart from this, molybdenum (Mo) is also in use as a crucible material for the wall parts, or base alloys of tungsten and molybdenum. A base alloy within the meaning of the invention is an alloy with an amount of the base element of at least 50% by wt. The refractory metals or alloys of said metals are however not entirely corrosion-resistant to molten quartz glass and react at high temperatures with oxygen from the quartz glass. Metal oxides are formed in this process and are enriched on the crucible wall and in the bottom portion of the crucible from where they are removed from time to time with the melt flow of the glass melt in a concentrated form and are then noticed as striae or discolorations of the quartz glass strand and also produce waste just like undissolved metal oxide particles in the quartz glass melt. The crucibles are composed of individual wall parts which are manufactured with the highest possible fitting accuracy. The wall parts are butt-joined and sintered during the melt operation. In this process, however, one achieves no gas tightness; this leads to bubble inclusions in the quartz glass melt. Moreover, a corrosive attack is also observed from the outside on the butt joints of the wall parts by contaminated or wet gases, which promotes the input of the refractory metal, normally tungsten, into the melt.

It is true that crucibles of highly melting metals of the group iridium, rhenium, osmium and ruthenium have a much better corrosion resistance to a quartz glass melt, they are however expensive. The formation of a crucible consisting of iridium is e.g. suggested in JP 02-022132 A.

As an alternative, it is possible to apply a protective layer of metals of the group iridium, rhenium, osmium and ruthenium only on the inside of a crucible otherwise consisting of tungsten or molybdenum. Crucibles of that type are e.g. known from U.S. Pat. No. 6,632,086 B1, U.S. Pat. No. 6,422,861 B1 and from U.S. Pat. No. 6,739,155 B1. It is suggested there that the crucible inside should be provided with protective layers consisting of iridium, rhenium, osmium or alloys of said coating metals. The protective layer is either metallurgically joined to the crucible wall, or it forms a separate insert which abuts on the crucible wall and is mechanically fixed thereto.

The last-described crucibles exhibit an improved corrosion resistance to quartz glass melts. The material costs for producing the crucibles are however very high because of the expensive coating metals for producing the protective layer. Moreover, even with the inner coating it is not possible to achieve an adequate gas tightness of the crucible wall.

TECHNICAL OBJECTIVE

Starting from this prior art, it is the object of the present invention to provide a component for use in a crucible pulling method for quartz glass with improved tightness, and to indicate a method for producing such a component.

GENERAL DESCRIPTION OF THE INVENTION

As for the method, this object starting from a method of the aforementioned type is achieved according to the invention in that a sealant is inserted into the joint.

It is intended in the method according to the invention that after the individual wall parts have been butt-joined with the highest possible fitting accuracy, a sealant is inserted into the evolving joint between the wall parts. The wall parts that are connected in this way are then sintered into a component at a temperature above 1500° C. The sealant acts as a sintering aid and ensures that the joint between the walls of the individual parts is closed in a gas-tight manner during sintering. The duration for the sintering process can be shortened with the help of the sealant, which is of benefit under economic aspects. Components that are produced according to the method of the invention are particularly suited for use in a crucible pulling method for quartz glass because gas tightness is here of importance.

Under the influence of a temperature of more than 1500° C. a mixed phase consisting of the material of the sealant and the refractory metal is formed due to the sealant on the contact surfaces of the wall parts. This accomplishes gas tightness on the joints, so that the penetration of contaminated or wet gases is avoided during the sintering of the wall parts and during the operation of the component. The sealing action between the individual parts of the component starts already before the sintering thereof, so that the sintering of the wall parts according to the method of the invention takes place at a faster pace than under the conventional method without a sealant because no gas, especially no oxygen, can pass to the contact surfaces of the wall parts. It is enough when the sealant is inserted into the joint of the butt-joined wall parts only from the outside and occupies only a small proportion of the whole wall thickness of the individual parts.

A sealant of hafnium, niobium or zirconium or of an alloy with hafnium, niobium or zirconium as the base element is particularly suited in the method according to the invention. Sealants consisting of said metals or metal alloys particularly easily form a mixed phase in contact with the refractory metal of the wall parts. Pure hafnium as the sealant forms a hafnium-tungsten alloy with wall parts of tungsten, said alloy promoting the sintering of the wall parts. Alloys of the three elements hafnium, niobium and zirconium can also be used as sealants; however, in addition to the processability as a sealant, corrosion resistance to oxidative melts and mechanical properties, such as ductility, are here important. Unavoidable further elements can be accepted as impurities in the alloys to a small degree, but a high purity should in principle be aimed at avoiding the potential formation of brittle, ceramic mixed phases, particularly carbides, which may impede the sintering of the wall parts.

With respect to the sintering behavior, it has turned out to be particularly advantageous when the sealant comprises a tungsten-hafnium alloy with a hafnium amount of 78% by wt. This alloy composition shows a melting point of about 1950° C. according to the tungsten-hafnium phase diagram. Hence, the sealant softens at a corresponding sintering temperature and can fill out the joint between the wall parts without any gap and can seal the same in a gas-tight manner.

As an alternative to hafnium, niobium or zirconium or to alloys of said elements, it is also possible to use a sealant of platinum or of a platinum alloy. When platinum or a platinum alloy is used as the sealant, one has to expect material costs higher than in the case of the use of non-precious high-melting metals, such as hafnium, niobium or zirconium. Platinum and platinum alloys, however, are equally suited as sealants within the meaning of the invention as are hafnium, niobium and zirconium. Platinum-tungsten alloys have turned out to be useful as platinum alloy; depending on the tungsten amount, these have a melting range between about 1850° C. and 1910° C.

Tungsten or molybdenum or a tungsten or molybdenum base alloy has turned out to be useful as a material for the wall parts. These refractory metals show a high melting point, a relatively low thermal expansion, and a comparatively high conductivity for heat and current, so that they are well suited as a material to be used at high temperatures, particularly for producing crucibles for quartz glass.

In a variant of the method according to the invention, the joint between the butt-joined wall parts comprises a groove into which the sealant is inserted. The abutting surfaces of the individual wall parts are here provided with a recess in the form of a groove into which the sealant is then inserted prior to the joining together of the wall parts. The sealant is thereby particularly well fixed in its position and cannot get lost upon impact, e.g. upon relocation of the wall parts that are still loosely joined to one another before the sintering of the individual parts As for the sealant, the sealant is inserted in the form of a structural component in a preferred variant of the method according to the invention. A finished part in a coherent geometric form is regarded as the structural component. This form of the sealant has the advantage that no additives, which have e.g. an influence on the adhesion or flowability of the sealant, are introduced into the joint and thereby constitute a potential source of impurities at that place.

It has turned out to be particularly advantageous when the sealant is inserted in the form of a wire. A wire with a round profile and with a wire diameter in the range of from 0.1 mm to 1.0 mm has turned out to be useful as an embodiment for the wire.

It is equally advantageous when a wire with a polygonal profile, preferably a triangular profile, is inserted. Round or angular wire profiles are standard forms that are commercially available in different dimensions. No significant additional effort is required in the production of the component due to the insertion of the sealant in the form of a wire.

This is also true for the alternative and equally preferred variant of the method in which the sealant is inserted in the form of a film with a film thickness in the range of from 0.05 mm to 0.5 mm. Films, e.g. of hafnium, are also commercially available structural components. Thin metal sheets are also regarded as films within the meaning of the invention.

As for the component, the above-mentioned object starting from a component of the aforementioned type is achieved according to the invention in that the joint is closed in a gas-tight manner by a sealant.

The component according to the invention is an article which gets into contact with $SiO_2$ in the pulling process. The melting crucible and its components, such as nozzles or nozzle holders, or pipes projecting into the quartz glass mass for the gas supply, enveloping bodies for measuring devices or mixing apparatus, shall be mentioned as examples. The operating temperature during the intended use of the component is clearly above 2000° C., normally in the temperature range between 2050° C. and 2300° C. The walls of the component consist substantially of metals that are highly temperature-resistant, for instance tungsten, and, apart from tungsten, niobium, molybdenum and tantalum are also suited. By inserting a sealant consisting of the group hafnium, niobium, zirconium or of an alloy with the base element hafnium, niobium or zirconium or by inserting a sealant consisting of platinum or of a platinum alloy the joint between the butted-joined wall parts is already closed in a gas-tight manner prior to sintering, so that the penetration of contaminated or wet gases during the sintering of the individual parts and during the operation of the component is avoided.

Hence, the component according to the invention is thus optimized for use at a high operating temperature in a crucible pulling method for quartz glass.

EMBODIMENT

The invention shall now be explained in more detail with reference to a patent drawing and an embodiment. In detail, FIGS. 1a, 1b are a schematic cross-sectional illustration of two butt-joined wall parts with a sealant inserted as a wire in the joint;

Figure 1A:
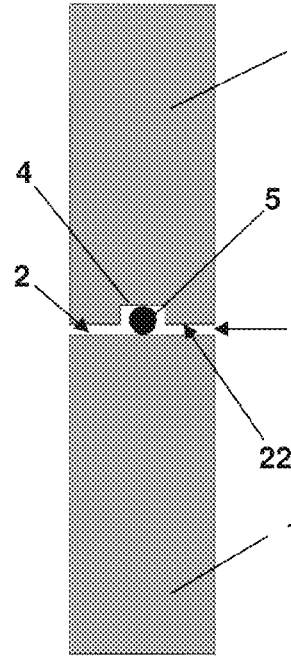
FIG. 1c is a schematic cross-sectional illustration of two butt-joined wall parts with a sealant inserted as a film in the joint.
Figure 1B:
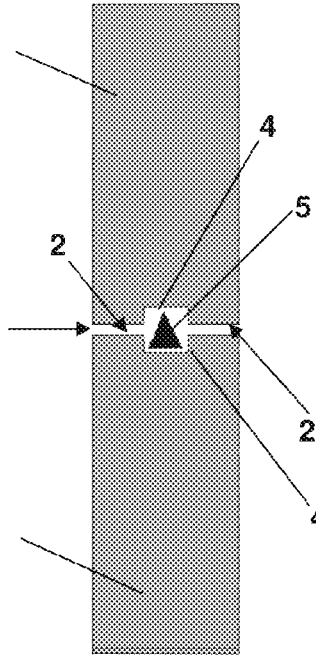

Each of FIGS. 1a and 1b shows in a schematic illustration a cross-sectional detail of a crucible wall of tungsten, composed according to the method of the invention of at least two individual wall parts 1 of a refractory metal, here tungsten. The abutting surfaces 2, 22 of the wall parts 1 are put together to form a joint 3. According to FIG. 1a one of the two abutting surfaces 2 is configured as a straight and smooth surface; the other abutting surface 22 has a contour in the form of a rectangular groove 4. A hafnium wire with a round profile is inserted into said groove 4 as a sealant 5 and is fixed by the groove 4. The hafnium wire has a diameter of 0.8 mm and projects slightly beyond the groove 4, which has a depth of less than 0.8 mm. The wall parts 1 are now joined together on their abutting surfaces 2, 22, whereby the hafnium wire gets deformed, fills out the groove 4 in this process and thereby seals the butt joints of the tungsten wall parts. Upon heating up of the wall parts during the melting operation of quartz glass to temperatures in the range of more than 2000° C. a tungsten-hafnium phase is formed at the connection points, the phase promoting the sintering of the wall parts 1 and thereby ensuring that gas, especially oxygen, is no longer flowing through the butt joint.

According to FIG. 1b both abutting surfaces 2, 22 of the wall parts 1 have a respective groove 4 in the same position, which during butt joining of the wall parts are overlapping to form a joint 3 with a cavity in the interior of the connection point into which in this case a hafnium wire with a triangular profile is inserted as the sealant 5. When the abutting surfaces 2, 22 are pressed together, the tip of the triangular wire is first deformed without any great effort and then also the base of the wire and thereby fills the groove 4. Hence, the deformed wire already forms a seal in the joint 3 even without application of an elevated temperature.

Figure 1C:
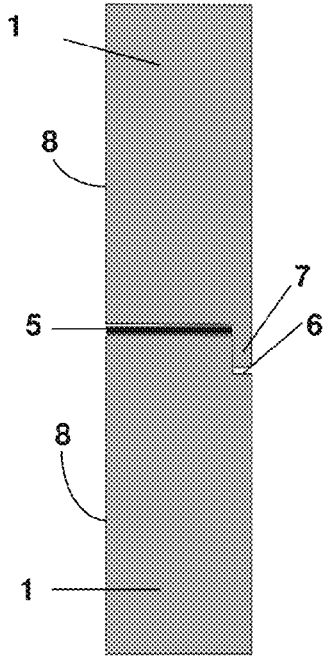

As an alternative to the embodiments according to FIGS. 1a and 1b, FIG. 1c shows two wall parts 1 with a positive or form-fit contour of the abutting surfaces 2, 22. The two abutting surfaces 2, 22 have a shoulder 6 and a protrusion 7, respectively, which engage each other and thereby center the two wall parts 1 relative to each other. A film package of a plurality of thin hafnium films with film thicknesses in the range of 0.05 mm to 0.3 mm is inserted into the developing joint 3 between the abutting surfaces 2, 22 from the outside 8 of the wall parts 1. By joining together the wall parts 1, the film or the film package forms a seal between the wall parts 1 which upon subsequent heating promotes the sintering of the wall parts.

Instead of the wire or the film of pure hafnium, it is possible to alternatively use a wire or a film of a hafnium-tungsten alloy with a hafnium amount of 78% by wt. as the sealant.

A sealant 5 which is inserted in the form of a platinum wire between the abutting surfaces 2, 22 is also operative in an analogous manner.

Figure 2:
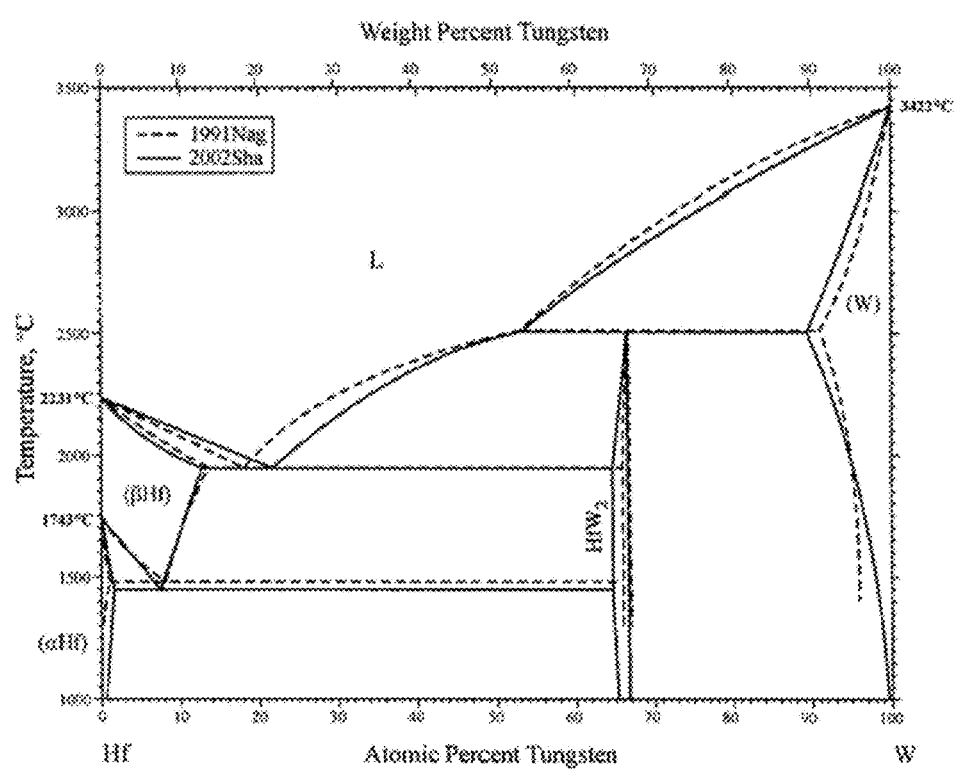
FIG. 2 shows a section of the phase diagram of the 2-component system tungsten-hafnium.

The phase diagram of the 2-component system tungsten-hafnium according to FIG. 2 originates from Phase Diagrams of Binary Tungsten Alloys, S. V. Nagender Naidu, Indian Institute of Metals, 1991, p 114-121, G. Shao, Thermodynamic Assessment of the Hf—Mo and Hf—W Systems, Intermetallics, Vol 10 (No. 5), 2002, p 429-434. The two authors Nagender (abbreviated as Nag, broken line) and Shao (abbreviated as Sha, continuous line) found a substantially identical phase diagram in separate measurements. The tungsten content and hafnium content, respectively, is plotted in atomic percent (at. %) on the lower X-axis and in weight percent (wt. %) on the upper X-axis. In the temperature range between 1900° C. and 2500° C. a W—Hf alloy with a melting temperature of about 1950° C. is thermodynamically stable, the alloy having an amount of 78% by wt. of hafnium. While the butt-joined wall parts 1 of tungsten are sintered with the help of the sealant 5 of hafnium, a mixed phase of hafnium and tungsten is formed on the joint. When a hafnium tungsten alloy is used as the sealant 5, tungsten diffuses during sintering out of the wall parts 1 into the hafnium-tungsten mixed phase of the sealant 5. The necessary temperature for sintering thereby rises slightly. At the same time, however, the temperature resistance of the component produced thereby is also rising.

The invention claimed is:

1. A method for producing a component, said method comprising: providing at least two wall parts of a refractory metal or of a base alloy of a
   refractory metal,
   aligning and abutting the wall parts so as to form a joint; and
   joining the wall parts together by sintering at a temperature above 1500° C. so as to form the component,
   wherein the method further comprises
   inserting a sealant consisting essentially of hafnium, niobium, zirconium or platinum, or of an alloy with hafnium, niobium, zirconium or platinum as a base element, supported in the joint.

2. The method according to claim 1, wherein the sealant is a tungsten-hafnium alloy with a hafnium amount of 78% by wt.

3. The method according to claim 1, wherein the joint between the butt-joined wall parts comprises a groove into which the sealant is inserted.

4. The method according to claim 1, wherein the sealant is inserted in the form of a structural component.

5. The method according to claim 1, wherein the sealant is inserted in the form of a wire.

6. The method according to claim 5, wherein the sealant has a round profile and a wire diameter in the range of 0.1 mm to 1.0 mm.

7. The method according to claim 5, wherein the sealant has a polygonal profile.

8. The method according to claim 1, wherein the sealant is inserted in the form of a film with a film thickness in the range of 0.05 mm to 0.5 mm.

9. The method according to claim 1, wherein tungsten or molybdenum or a tungsten or molybdenum base alloy is used as the refractory metal for the wall parts.

10. The method according to claim 5, wherein the sealant has a triangular profile.

11. The method according to claim 1, wherein the component is a melting crucible configured for use at a high operating temperature in a crucible pulling method for quartz glass.

* * * * *